(12) United States Patent
Ishikawa et al.

(10) Patent No.: US 7,696,650 B2
(45) Date of Patent: Apr. 13, 2010

(54) DRIVING CIRCUIT FOR SWITCHING ELEMENTS

(75) Inventors: Katsumi Ishikawa, Hitachinaka (JP); Hideki Miyazaki, Hitachi (JP); Koichi Suda, Mito (JP); Katsunori Suzuki, Takahagi (JP)

(73) Assignee: Hitachi, Ltd. (JP)

( * ) Notice: Subject to any disclaimer, the term of this patent is extended or adjusted under 35 U.S.C. 154(b) by 0 days.

(21) Appl. No.: 12/204,127

(22) Filed: Sep. 4, 2008

(65) Prior Publication Data
US 2008/0315938 A1 Dec. 25, 2008

Related U.S. Application Data

(63) Continuation of application No. 11/169,776, filed on Jun. 30, 2005, now abandoned.

(51) Int. Cl.
*H01H 9/54* (2006.01)

(52) U.S. Cl. ................... 307/143; 307/113; 307/139

(58) Field of Classification Search ............. 307/113, 307/139, 143
See application file for complete search history.

(56) References Cited

U.S. PATENT DOCUMENTS
6,360,090 B1 3/2002 Holcombe et al.

FOREIGN PATENT DOCUMENTS
JP 9-172366 6/1997

*Primary Examiner*—Albert W Paladini
*Assistant Examiner*—Hal I Kaplan
(74) *Attorney, Agent, or Firm*—Antonelli, Terry, Stout & Kraus, LLP.

(57) ABSTRACT

A level shifting circuit, satisfying a requirement of a high tolerated dV/dt level, and a highly reliable inverter circuit, wherein a set pulse signal and a reset pulse signal, both of which are level-shifted to a potential side taking as reference a reference potential of a gate control terminal of a switching terminal, are obtained differentially and integrated, and, in case these pulse signals equal or exceed stipulated integrated values, are transmitted as regular control signals controlling the on/off state.

2 Claims, 8 Drawing Sheets

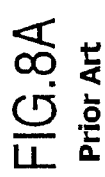

DRIVING CIRCUIT FOR SWITCHING ELEMENTS

The present application is a Continuation application of U.S. application Ser. No. 11/169,776, filed Jun. 30, 2005, now abandoned the entire content of which is incorporated herein by reference.

BACKGROUND OF THE INVENTION

1. Field of the Invention

The present invention pertains to a drive circuit for semiconductor power switching elements.

2. Description of the Related Art

Inverter devices are well known wherein a first switching element and a second switching element are respectively placed on a low voltage side arm (below called the "lower side") and a high voltage side arm (below called the "upper side"), the two arms being connected between the terminals of a main power supply, and the first and the second switching elements are connected in series.

In such a device, the second switching element connected to the upper side is driven in a floating potential state with respect to the reference potential, and the drive circuit includes a power supply externally insulated from a transformer. Also, in order to transmit drive signals from the low voltage side circuit to the high voltage side circuit, a level shifting (below called lower to upper level shift) device is necessary for which the transmission of a signal is possible even in the floating potential state.

Moreover, the level shifters performing signal transmission from the high voltage side circuit to the low voltage side circuit are called upper to lower level shifters. The integrated circuit (IC) incorporating these is usually called a gate driver IC. A lower to upper level shift circuit such as this is e.g. described in JP-A-9-172366.

FIG. 7 is a circuit diagram showing the configuration of the drive circuit of the prior art semiconductor device shown in FIG. 2 of JP-A-9-172366. In FIG. 7, an IGBT (Insulated Gate Bipolar Transistor) 24, being the switching element of an upper arm 232, and an IGBT 25, being the switching element of a lower arm 233, are connected in series to both terminals of a main power supply 23 and constitute a half bridge. The cathode side of main power supply 23 is at earth (ground) potential Ve.

Freewheel diodes 26 and 27 are connected to IGBT 24 and IGBT 25. And then, a load 28 (an inductive load like a motor) is connected to connection point 251 of IGBT 24 and IGBT 25.

IGBT 24 of upper side 232 operates as a switch, with contact point 251 of upper side 232 and lower side 233 as the reference voltage. An upper-side regulating power supply 21 supplying power to a drive circuit and protection circuit 39 for the upper side is externally insulated by means of a transformer not illustrated.

IGBT 25 of lower side 233 operates as a switch with the ground potential as the reference voltage. A lower-side regulating power supply 22 supplying power to a drive circuit and protection circuit 40 for the lower side is externally insulated by means of a transformer.

Next, an explanation of the circuit driving IGBT 24 of upper side 232 will be given. A pulse generating circuit 31 generates, in response to an input signal supplied by an externally provided microcomputer (not illustrated) or the like, pulse shape on/off signals. Two output terminals thereof are respectively connected to the gate electrodes of level shifting high voltage nMOSFET (n-type Metal Oxide Semiconductor Field Effect Transistor) 32 and high voltage nMOSFET 33.

The drain electrodes of high breakdown voltage nMOSFET 32 and high breakdown voltage nMOSFET 33 are respectively connected to one terminal portion of resistances 35, 34 as well as to the input sides of inverter circuits 41, 45. Zener diodes 36, 37 are connected in parallel to resistances 34, 35.

The outputs of inverter circuits 41, 45 are in addition connected to a set input (S) and a reset(R) input of a flip-flop circuit 38 via inverter circuits 42, 46, and through filters composed of resistances 43, 47 and capacitors 44, 48. The output (Q)of flip-flop circuit 38 is connected to drive circuit and protection circuit 39. IGBT 24 of upper side 232 is driven by drive circuit and protection circuit 39.

With the drive circuit for the upper side 232 such as this, IGBT 24 of upper arm 232 changes abruptly, by the switching operation of IGBT 25 of lower arm 233, from 0 V up to the rated voltage of main power supply 23 or more, with point 251 of contact with IGBT 25 of lower arm 233 as the reference potential (reference potential of regulating power supply 21 of upper arm 232).

Since there exists a parasitic capacitance C between the drain and source of nMOSFET 32 and nMOSFET 33, when a particularly fast dV/dt transient is generated, the current obtained by multiplying parasitic capacitance C and the dV/dt transient (hereafter called "dV/dt current") flows simultaneously through high voltage nMOSFET 32 and high breakdown voltage nMOSFET 33.

The dV/dt current flowing in high breakdown voltage nMOSFET 32 and high voltage nMOSFET 33 is at the same level as the current normally flowing during switching, and there arises a voltage drop across resistances 34, 35 at the same time. Because of this, it simultaneously comes about that a set signal and a reset signal are supplied to the set input and the reset input of flip-flop circuit 38.

In general, simultaneously inputting a set signal and a reset release signal to the set input and the reset input of flip-flop circuit 38 is forbidden and leads to unpredictable operation.

The fact that, in order to prevent unpredictable operation such as this, one should set the resistance value of resistances 34, 35 and the first threshold value of inverters 41, 42 to distinguish the voltage drop across resistances 34, 35 due to the dV/dt transient and the voltage drop due to the signal from pulse generation circuit 31, makes a setting with extremely high precision necessary. In JP-A-9-172366, for the case of high dV/dt transients, it is suggested to carry out a measure against erroneous dV/dt operation by means of pulse filters configured with resistances 43, 47 and capacitors 44, 48.

SUMMARY OF THE INVENTION

As shown in JP-A-9-172366, there is carried out a measure against erroneous dV/dt operation by means of pulse filters configured with resistances 43, 47 and capacitors 44, 48, but with these filters, elimination is possible only when the noise bandwidth is smaller than the time constant determined by resistance 43 and capacitor 44.

According to this configuration, for high dV/dt transient characteristics, transient times are short and measures against erroneous operation are possible. However, in the case of low dV/dt transient characteristics, i.e., when the transient time is greater than the time constant determined by resistance 43 and capacitor 44, there are limits to the capacity to prevent erroneous operation.

The drive circuit for switching devices of the present invention comprises: a first and a second switching device connected in series between the terminals of a main power supply; a first regulating power supply taking as reference the potential on the ground side of the first switching device; a second regulating power supply taking as reference potential the potential of the connection point of the first and the second switching devices; a pulse generator generating a set pulse signal and a reset pulse signal; and a level shifting device shifting the level of the set pulse signal and the reset pulse signal to the potential side taking as reference potential the potential of the connection point of the first and second switching devices, supplying the same set pulse and reset pulse signals to a flip-flop circuit, and controlling the on/off state of the second switching device; wherein the level shifting device comprises a comparator circuit outputting the difference of the set pulse signal and the reset pulse signal level shifted to the potential side taking as reference potential the potential of the connection point of the first and second switching elements, and, when the same difference equals or exceeds a setting value, transmits it as the regular signal to the gate of the second switching device.

According to the present invention, it becomes possible to attain making a level shifting circuit more reliable by improving the tolerated level of dV/dt transients.

Other objects, features and advantages of the invention will become apparent from the following description of the embodiments of the invention taken in conjunction with the accompanying drawings.

BRIEF DESCRIPTION OF THE DRAWINGS

FIGS. 8A to 8P are diagrams explaining the signal waveforms of a comparative example and the first embodiment of the present invention.

DESCRIPTION OF THE EMBODIMENTS

The embodiments of the present invention will be explained in detail using the drawings below.

Embodiment 1

Figure 1:
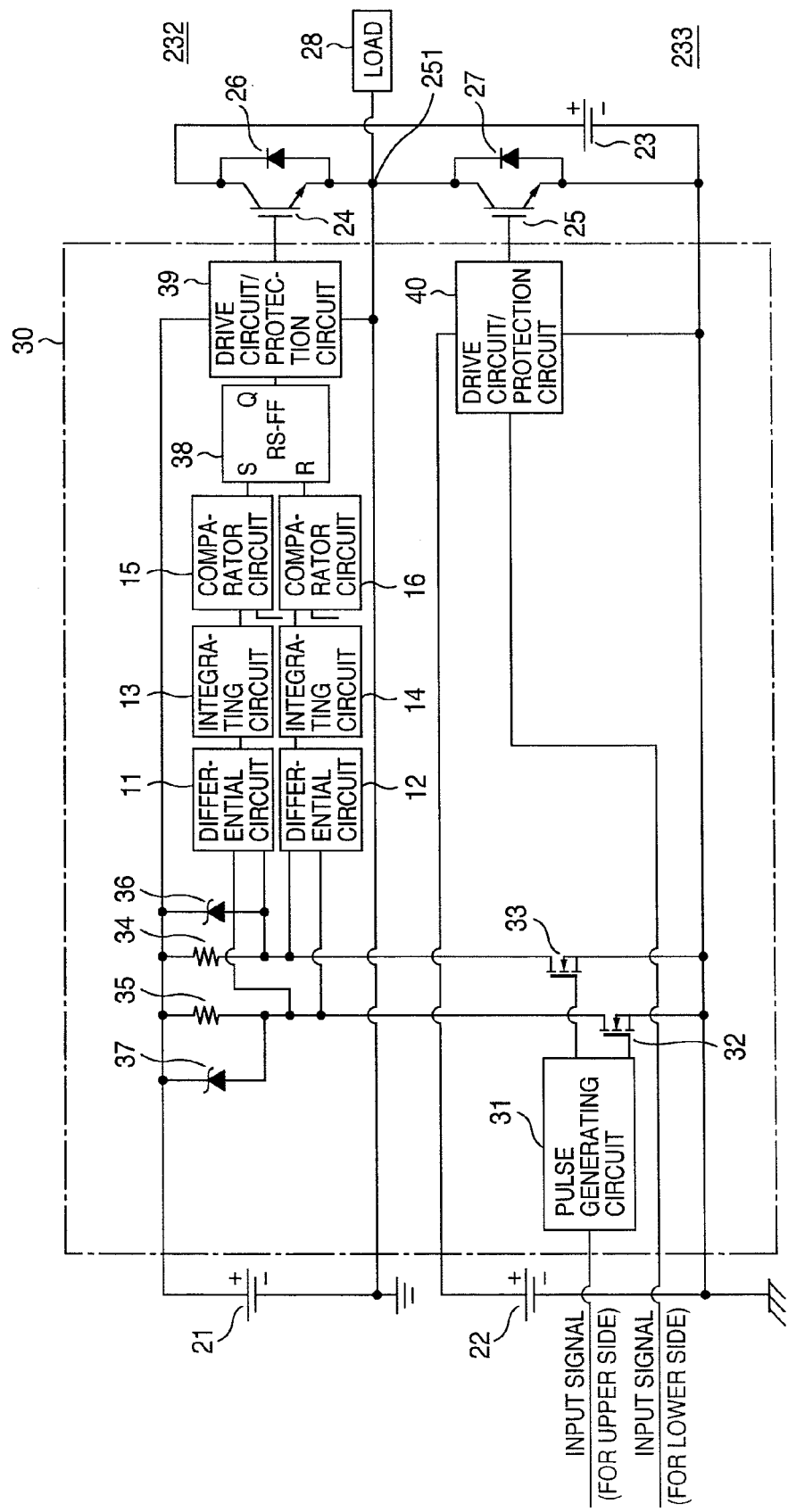
FIG. 1 is a circuit block diagram showing a first embodiment of the present invention.

FIG. 1 is a block diagram showing the drive circuit of driver IC 30, a semiconductor device for driving a semiconductor power switching device being the embodiment. An IGBT (Insulated Gate Bipolar Transistor) 24, being the semiconductor power switching device (hereinafter abbreviated as "switching device") of an upper side 232, and an IGBT 25, being the switching device of a lower side 233, are connected in totem-pole to both terminals of a main power supply 23 and constitute a half bridge. The cathode side of main power supply 23 is connected to ground.

Freewheel diodes 26, 27 are connected in anti-parallel to IGBT 24 and IGBT 25. And, a load 28 (an inductive load like a motor) is connected to a connection point 251 of IGBT 24 and IGBT 25.

IGBT 24 of upper side 232 is a device performing switching operation, taking as reference potential the potential of the point 251 of contact with IGBT 25 of lower side 233, and an upper side regulating power supply 21 insulated by means of a transformer is the power supply for a drive circuit and protection circuit 39 for the upper arm. Consequently, the reference potential of upper side regulating power supply 21 is the potential of contact point 251.

Also, IGBT 25 of lower side 233 is a device performing switching operation, taking the ground potential as reference potential, and a lower side regulating power supply 22, supplying electric power to a drive circuit and protection circuit 40 for the lower side, is insulated by means of a transformer. Consequently, the reference potential of lower side regulating power supply 22 is the ground potential.

In the following, an explanation will be given regarding the drive circuit controlling the drive of IGBT 24 of upper side 232. A pulse generating circuit 31 generates the pulse shape on/off signals in response to an input signal supplied from an externally provided microcomputer or the like. Two outputs thereof are supplied to the gate electrodes of level shifting high voltage nMOSFET 32 and high voltage nMOSFET 33.

The drain electrodes of high voltage nMOSFET 32 and high voltage nMOSFET 33 are respectively connected to one terminal portion of level shifting resistances 34, 35, and the potentials of the connection points of resistance 34 and high voltage nMOSFET 33, and of resistance 35 and high voltage nMOSFET 32 are respectively inputted to a set differential amplifier circuit 11 and a reset difference circuit 12.

In these differential amplifier circuits 11, 12, the respective differences of the set signals and the reset signals are outputted and, for regular signals, integrated by set integrating circuit 13 and reset integrating circuit 14 in the following stage. In a set comparative circuit 15 and a reset comparative circuit 16 in the stage following thereafter, it is judged whether the signal levels are regular, and regular signals are outputted and inputted as signals to the set (S) input and the reset (R) input of flip-flop circuit 38.

The output (Q) of the flip-flop circuit 38 is connected to drive circuit and protection circuit 39, and IGBT 24 of upper arm 232 is driven by this drive circuit and protection circuit 39. Further, in the present embodiment, driver IC 30 in FIG. 1 is formed on a silicon semiconductor substrate which is the same for pulse generating circuit 31, the level shifting circuits, comparator circuit 15, flip-flop circuit 38, and drive circuit 39. In addition, it is also possible to form IGBT 24 and IGBT 25 on the same silicon semiconductor substrate.

Figure 2:
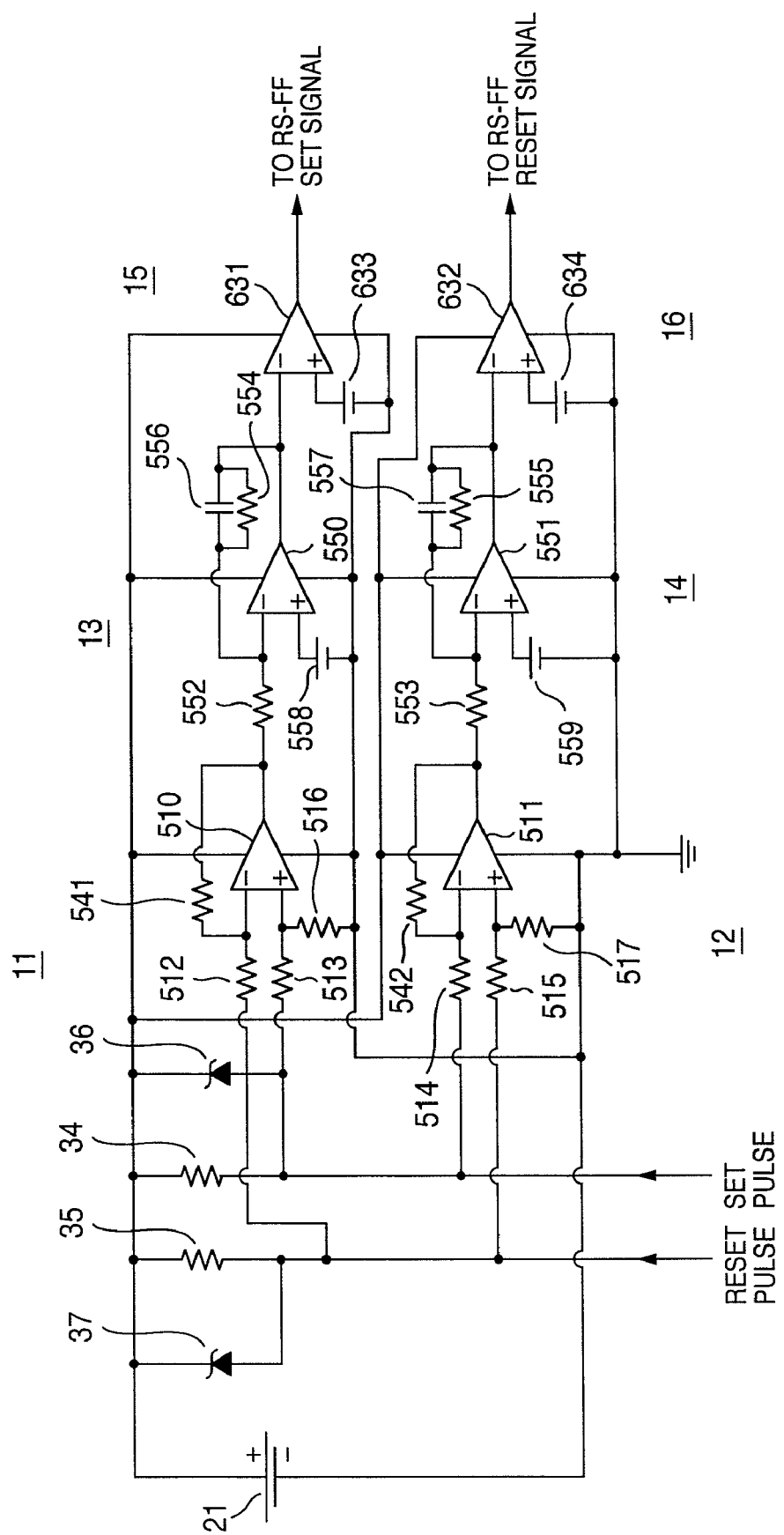
FIG. 2 is a detail view of the level shifting circuit of the first embodiment of the present invention.

FIG. 2 is an example of a circuit diagram showing the details of the level shifting circuit portion of the embodiment shown in FIG. 1. Differential amplifier circuits 11, 12 respectively comprise operational amplifiers 510, 511, input resistances 512, 513, 514, 515, reference resistances 516, 517, and feedback resistances 541, 542.

Integrating circuits 13, 14 comprise operational amplifiers 550, 551, input resistances 552, 553, and feedback resistances 554, 555 and integrating capacitors 556, 557, the feedback resistors and integrating capacitors being connected in parallel. Reference potentials 558, 559 are provided to the positive input terminals of operational amplifiers 550, 551.

Comparator circuits 15, 16 comprise operational amplifiers 631, 632, one input terminal each of which is respectively supplied a reference voltage 633, 634. The outputs of operational amplifiers 631, 632 are respectively supplied as the set signal and the reset signal of flip-flop circuit 38 shown in FIG. 1.

There exists a parasitic capacitance C between the drain and source of NMOSFET 32 and nMOSFET 33 in FIG. 1.

Due to the switching operation of lower side IGBT 25, there is generated, taking as reference potential (the reference potential of upper side regulating power supply 21) the potential of connection point 251 of IGBT 24 of upper arm 232 and IGBT 25 of lower arm 233, a dV/dt transient signal which changes abruptly in a short time.

For that reason, the current obtained by multiplying the parasitic capacitance C and the dV/dt transient (hereafter called "dV/dt current") flows simultaneously in high voltage nMOSFET 32 and high voltage nMOSFET 33 and a voltage drop of the same level is generated in resistances 34, 35.

Nevertheless, since, in set differential amplifier circuit 11 and reset differential amplifier circuit 12, the difference in voltage generated by the currents flowing simultaneously is obtained, as mentioned above, the outputs of differential amplifier circuits 11, 12 become nearly zero.

For this reason, the simultaneous inputting of signals to the set input and the reset input of flip-flop circuit 38 is eliminated, so it becomes possible to prevent producing unpredictable operation, that is, erroneous operation, and to attain a level shifting circuit with a high tolerated dV/dt level.

FIGS. 8A to 8P are diagrams showing the transformation of the signal waveforms of a comparative example. FIG. 8A shows the input signal, FIG. 8B shows the output waveform of high voltage nMOSFET 33, FIG. 8C shows the output waveform of high voltage nMOSFET 32, FIGS. 8D and 8E show the output waveforms of inverters 41, 45, FIGS. 8F and 8G show the waveforms of the set pulse and the reset pulse, and FIG. 8H shows the waveform of the gate signal supplied to the gate control terminal of IGBT 24. As shown in FIGS. 8A to 8H, it is evident that entering noise is included in the set signal and the reset signal.

FIGS. 8I to 8P are diagrams showing the transformation of the signal waveforms in the present embodiment. FIG. 8I shows the input signal, FIG. 8J shows the output waveform of high voltage nMOSFET 33, FIG. 8K shows the output waveform of high voltage nMOSFET 32, FIGS. 8L and 8M show the output waveforms of differential amplifier circuits 11, 12, FIGS. 8N and 8O show the waveforms of integrating circuits 13, 14, and FIG. 8P shows the waveform of the drive signal supplied to IGBT 24 by drive circuit and protection circuit 39. The waveforms shown in FIGS. 8N and 8O illustrate the supply of the set signal and the reset signal to flip-flop 38 by comparator circuits 15, 16 when the outputs of integrating circuits 13, 14 exceed a set value. In the present embodiment, it is evident that entering noise is removed.

Embodiment 2

Figure 3:
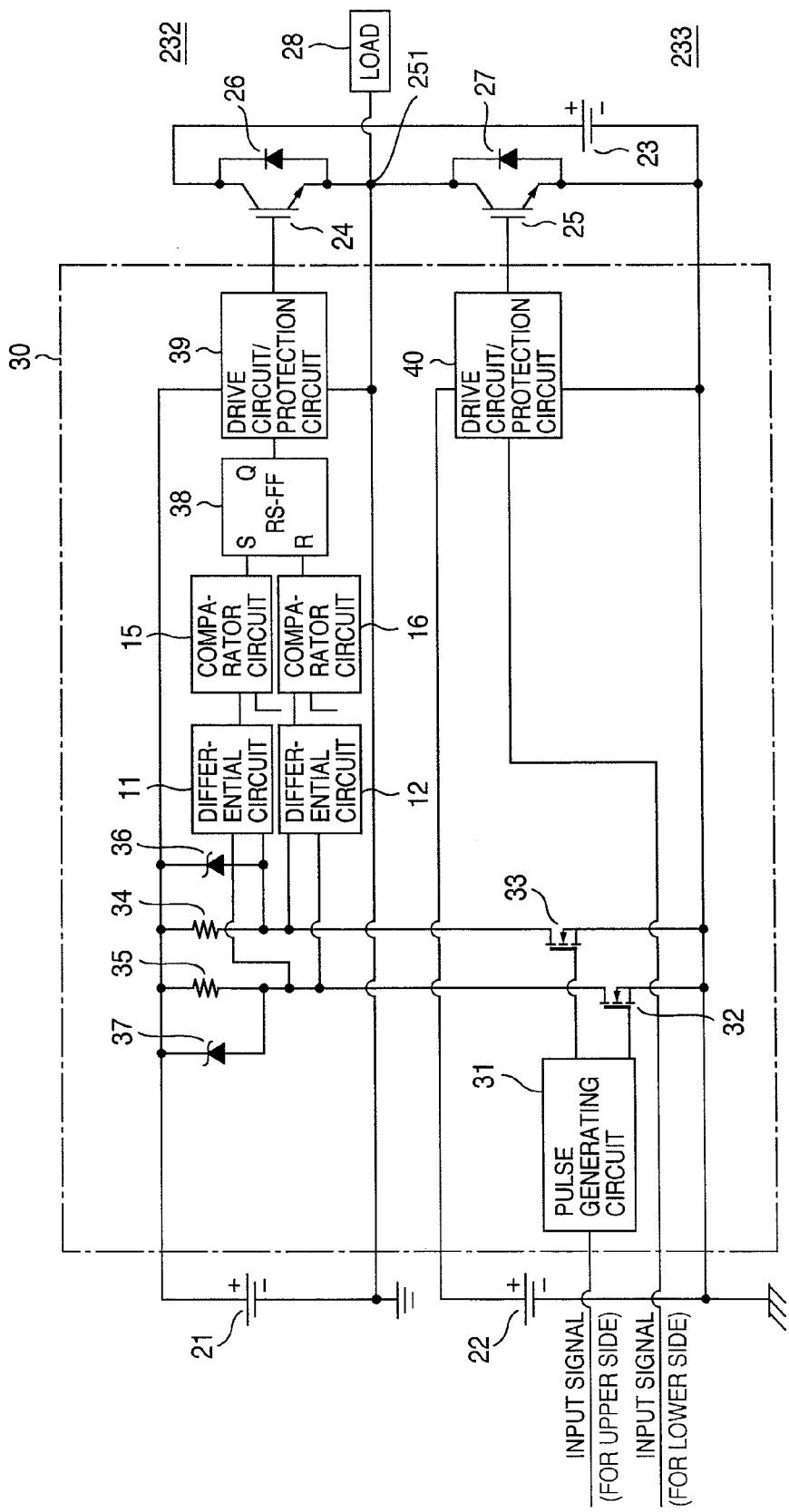
FIG. 3 is a circuit block diagram showing a second embodiment of the present invention.

FIG. 3 is block diagram showing the present embodiment 2. To constituent elements identical to those of FIG. 1, identical symbols are attached. The present embodiment has the configuration of Embodiment 1, but with integrating circuits 13, 14 removed.

The differential voltage, during normal operation, is outputted with a value corresponding to the pulse width. Because of this, it is determined to be at a regular level and is outputted as a normal signal, and is inputted as a signal to the set input and the reset input of flip-flop circuit 38.

Moreover, in case a dV/dt transient signal is generated, since the difference of the simultaneously flowing currents is obtained in set differential amplifier circuit 11 and reset differential amplifier circuit 12, the outputs of the differential amplifier circuits almost reach zero. Consequently, in these circuits, since differential voltages are obtained, the outputs of the differential amplifier circuits almost reach zero, and simultaneous signal inputting to the set input and the reset input of flip-flop circuit 38 is eliminated, so it becomes possible to prevent generating unpredictable operation, that is, erroneous operation, and to attain a level shifting circuit with a high tolerated dV/dt level.

Figure 4:
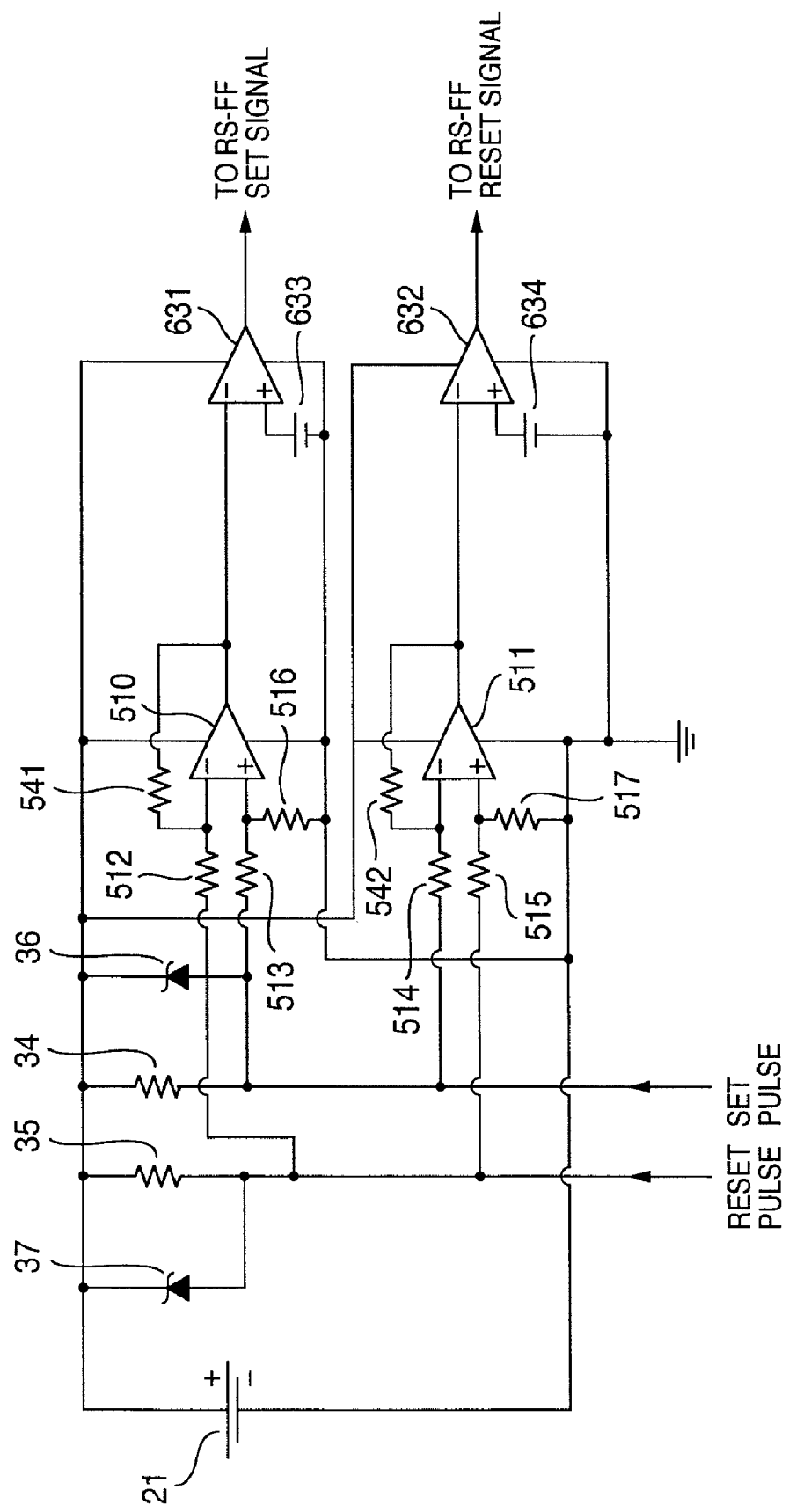
FIG. 4 is a detail view showing the level shifting circuit of the second embodiment of the present invention.

In FIG. 4, the details of the level shifting circuit portion of the present embodiment is shown. In the same way as in FIG. 2, differential amplifier circuits 11, 12 comprise operational amplifiers 510, 511, and comparator circuits 15, 16 comprise operational amplifiers 631, 632. Apart from the fact that there are no integrating circuits 13, 14, the configuration is the same as that in FIG. 2, and since the operation is also the same, an explanation of it is omitted. Further, for constituent elements having the same functions as in FIG. 2, the same reference numerals are attached.

Embodiment 3

Figure 5:
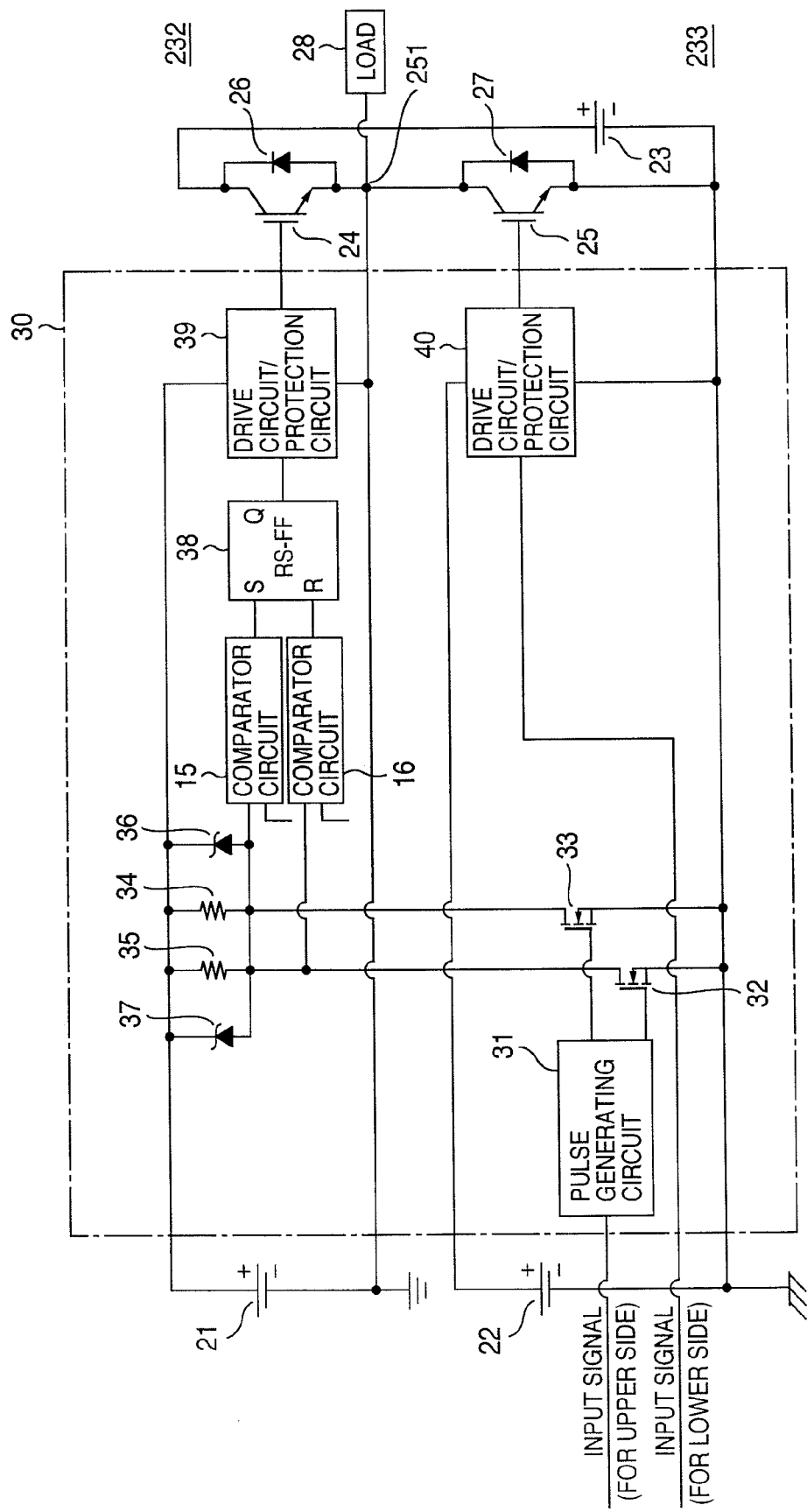
FIG. 5 is a circuit block diagram showing a third embodiment of the present invention.

FIG. 5 is a block diagram showing the circuits of the present embodiment. Elements identical to those in Embodiment 1 have the same symbols attached. The present embodiment has the configuration of Embodiment 2, but with differential amplifier circuits 11, 12 removed, and the voltages of level shifting resistances 34, 35 are supplied directly to comparator circuits 15, 16.

With comparator circuits 15, 16, it is possible to set a low level for the variation in reference potential, and, by taking advantage of the delay time of comparator circuits 15, 16, the integrated value of the regular signal and the integrated value of the dV/dt noise signal are calculated in advance. When the comparison voltages of comparator circuits 15, 16 are set appropriately, simultaneous inputting of signals in the set input and the reset input of flip-flop circuit 38 is eliminated, even in the present configuration. Because of this, it becomes possible to prevent generating unpredictable operation, that is, erroneous operation, and to attain a level shifting circuit with a high tolerated dV/dt level.

Figure 6:
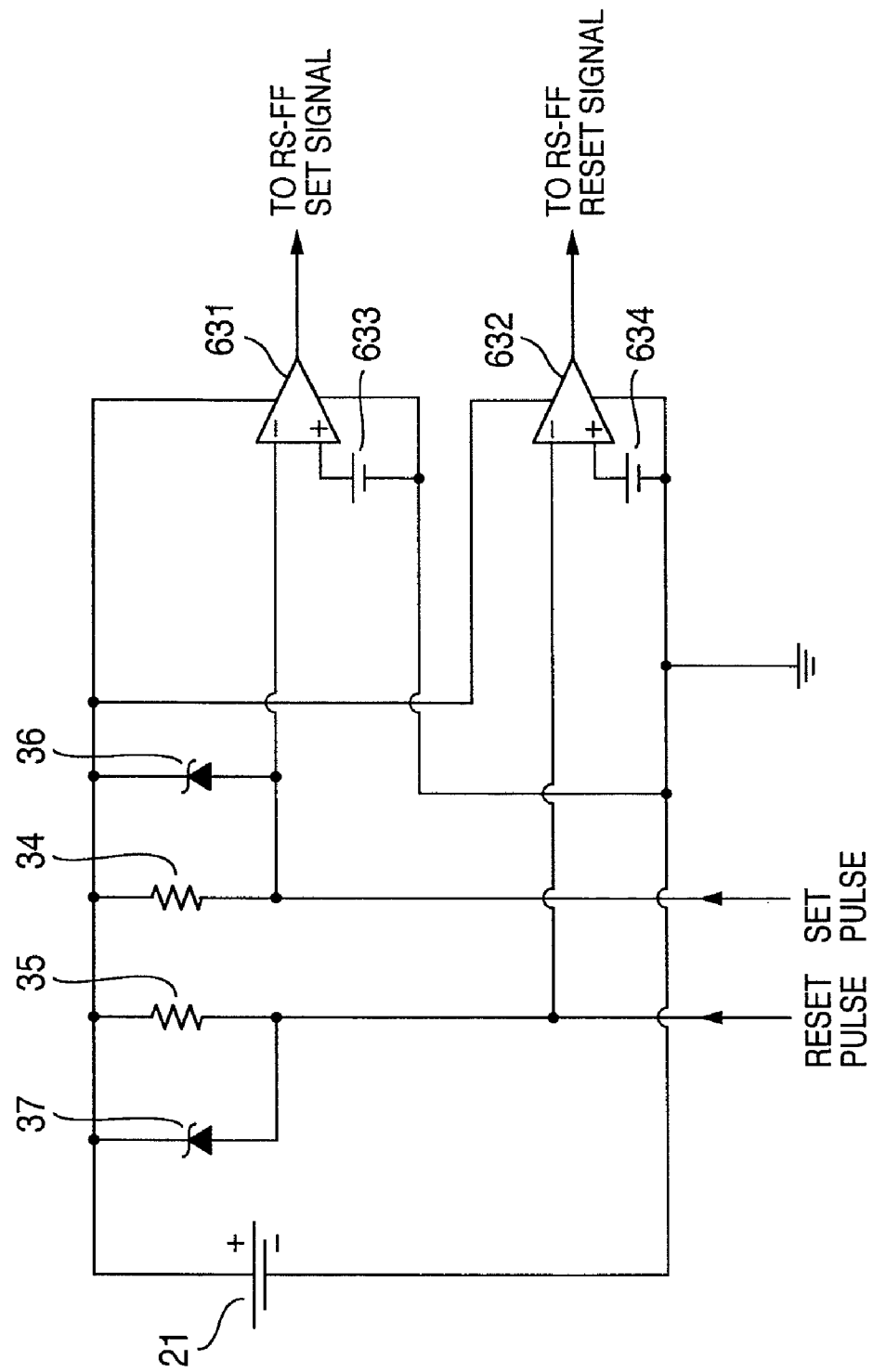
FIG. 6 is a detail view showing the level shifting circuit of the third embodiment of the present invention.
Figure 7:
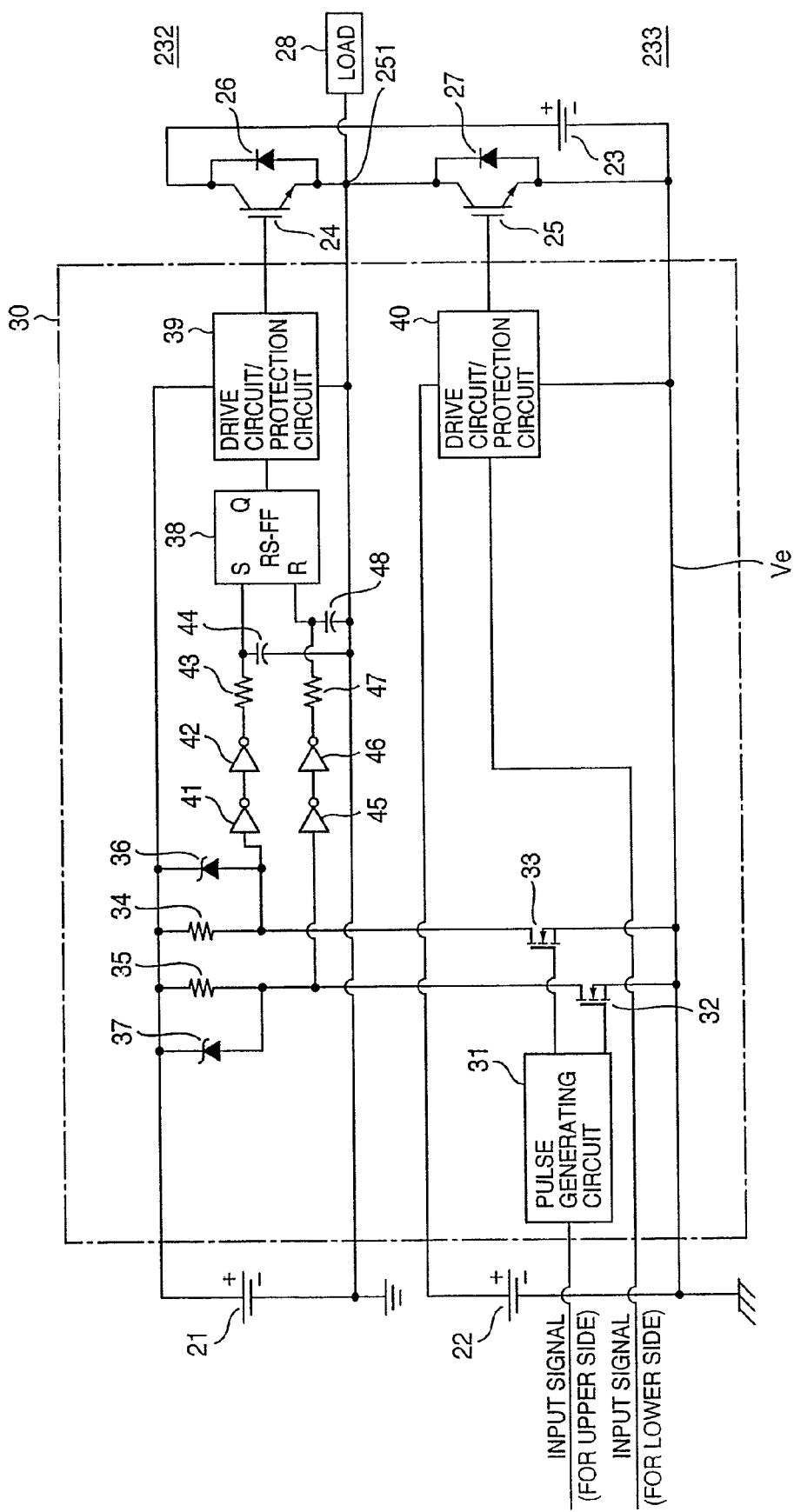
FIG. 7 is a circuit block diagram of the prior art.

In FIG. 6, the details of the level shifting circuit part of the present embodiment is shown. In the present embodiment, comparator circuits 15, 16 comprise operational amplifiers 631, 632.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A drive circuit for switching devices, comprising:
    a first switching device and a second switching device which are connected in series between terminals of a main power supply;
    a first control power supply taking as reference potential ground potential of said first switching device;
    a second control power supply taking as reference potential a potential of a connection point of said first and second switching devices;
    a pulse generator taking as reference potential the ground potential of said first switching device and generating a set pulse signal and a reset pulse signal; and
    a level shifting device level-shifting the set pulse signal and the reset pulse signal to the reference potential which is the potential of the connection point of said first and second switching devices, and supplying the set pulse signal and the reset pulse signal to a flip-flop circuit and controlling on/off state of said second switching device;
    wherein said level shifting device comprises:

differential amplifier circuits outputting a difference of the set pulse signal and the reset pulse signal, both level shifted to the reference potential which is the potential of the connection point of said first and second switching devices, integrating circuits integrating the outputs of said differential amplifier circuits, and comparator circuits which, when integrated values which are the outputs of said integrating circuits are equal to or exceed a setting value, transmit said signals as regular control signals controlling on/off state to a gate of said second switching device, so that in-phase noise on the set pulse signal and on the reset pulse signal when driving said second switching device is absorbed.

2. The drive circuit in accordance with claim 1, wherein said level shifting device further comprises level shifting circuits for the set pulse signal and the reset pulse signal, to which switching elements and resistances are respectively connected in series, and said differential amplifier circuits take as inputs the potential of the connection points of the switching elements and the resistances of said level shifting circuits.

* * * * *